US012720643B2

(12) United States Patent
Lee et al.

(10) Patent No.: US 12,720,643 B2
(45) Date of Patent: Aug. 25, 2026

(54) HEATER ARRAY AND APPARATUS FOR PROCESSING A SUBSTRATE INCLUDING AN HEATER ARRAY

(71) Applicant: Semes Co., Ltd., Cheonan-si (KR)

(72) Inventors: Chungwoo Lee, Suwon-si (KR); Sungyoun Jeon, Cheonan-si (KR); Inkyu Park, Gunpo-si (KR); Yongseok Jang, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 1179 days.

(21) Appl. No.: 17/645,464

(22) Filed: Dec. 22, 2021

(65) Prior Publication Data

US 2022/0210871 A1 Jun. 30, 2022

(30) Foreign Application Priority Data

Dec. 30, 2020 (KR) ........................ 10-2020-0187300

(51) Int. Cl.

| | |
|---|---|
| ***H05B 1/02*** | (2006.01) |
| ***H05B 3/22*** | (2006.01) |
| ***H05B 3/26*** | (2006.01) |
| ***H10P 72/00*** | (2026.01) |

(52) U.S. Cl.

CPC ............... *H05B 1/023* (2013.01); *H05B 3/22* (2013.01); *H05B 3/26* (2013.01); *H05B 1/0233* (2013.01); *H10P 72/0431* (2026.01)

(58) Field of Classification Search

CPC . H05B 1/023; H05B 3/22; H05B 3/26; H05B 1/0233; H01L 21/67098

See application file for complete search history.

(56) References Cited

U.S. PATENT DOCUMENTS

| | | | | |
|---|---|---|---|---|
| 3,875,563 | A * | 4/1975 | Hosokawa | H10D 84/00 257/E27.07 |
| 5,268,558 | A * | 12/1993 | Youssef | H05K 7/20 219/209 |
| 7,692,959 | B2 | 4/2010 | Krusin-Elbaum et al. | |
| 12,040,204 | B2 | 7/2024 | Steinhauser | |
| 2013/0098895 | A1 * | 4/2013 | Swanson | H05B 3/06 219/508 |

(Continued)

FOREIGN PATENT DOCUMENTS

| | | |
|---|---|---|
| KR | 10-2014-0084010 A | 7/2014 |
| KR | 10-2014-0130215 A | 11/2014 |

OTHER PUBLICATIONS

IP.com search report (Year: 2025).*

(Continued)

*Primary Examiner* — Elizabeth M Kerr
*Assistant Examiner* — Keith Brian Assante
(74) *Attorney, Agent, or Firm* — DALY, CROWLEY, MOFFORD & DURKEE, LLP

(57) ABSTRACT

An apparatus for processing a substrate may include a process chamber in which a desired process is performed, a supporting unit disposed in the process chamber, and a heater array disposed in the supporting unit. The heater array may include a plurality of heaters providing a plurality of heating areas, a plurality of diodes electrically connected to the plurality of heaters, respectively, and a controller operating the plurality of heaters. Here, adjacent diodes in the plurality of heating areas are arranged in opposed directions.

12 Claims, 5 Drawing Sheets

(56) References Cited

U.S. PATENT DOCUMENTS

| | | | | |
|---|---|---|---|---|
| 2013/0220989 | A1* | 8/2013 | Pease | H01L 21/67103 219/458.1 |
| 2014/0048529 | A1* | 2/2014 | Pease | H05B 1/0202 219/494 |
| 2014/0154819 | A1* | 6/2014 | Gaff | H01L 22/14 156/345.52 |
| 2018/0040496 | A1* | 2/2018 | Lee | H01L 21/67248 |
| 2019/0291698 | A1* | 9/2019 | Camella | H05B 3/26 |
| 2020/0211873 | A1* | 7/2020 | Zhao | H01L 21/67248 |
| 2021/0384053 | A1* | 12/2021 | Jing | H01L 21/67248 |
| 2022/0068691 | A1* | 3/2022 | Tian | H01J 37/32715 |

OTHER PUBLICATIONS

Korean Office Action (with Machine English Translation from Espacenet.com) dated Jul. 15, 2024 for Japanese Application No. 10-2020-0187300; 18 Pages.

* cited by examiner

HEATER ARRAY AND APPARATUS FOR PROCESSING A SUBSTRATE INCLUDING AN HEATER ARRAY

CROSS-REFERENCE TO RELATED APPLICATION

This application claims priority to Korean Patent Application No. 10-2020-0187300 filed on Dec. 30, 2020 in the Korean Intellectual Property Office (KIPO), the contents of which are herein incorporated by reference in its entirety.

BACKGROUND

1. Field

Example embodiments of the invention relate to a heater array and an apparatus for processing a substrate including a heater array. More particularly, example embodiments of the invention relate to a heater array having a simplified matrix structure and an apparatus for processing a substrate including such heater array.

2. Related Technology

In manufacturing processes for a display device such as an organic light emitting display device, an apparatus for processing a substrate generally includes various processing chambers such as a deposition chamber, a sputtering chamber, an etching chamber, a cleaning chamber, a drying chamber, etc. Such processing chamber may include a supporting unit on which a substrate is placed and a heater array having a matrix structure.

The conventional heater array of the matrix structure may have a configuration in which all of diodes electrically connected to a plurality of heaters are arranged in one direction so that the conventional heater array may require the numbers of control lines equal to the sum of the number of rows of the matrix structure and the number of columns of the matrix structure in order to individually operate the plurality of heaters. However, if the number of the heaters in the heater array is increased to provide more heating areas, the wirings for electrical connections of the components in the apparatus for processing a substrate including the heater array may be complicated, and also the structural complexity of the apparatus for processing a substrate may be increased.

SUMMARY

In one aspect of the invention, there is provided a heater array having a simplified matrix structure by reducing the number of control lines.

In another aspect of the invention, there is provided an apparatus for processing a substrate including a heater array having a simplified matrix structure by reducing the number of control lines.

According to an aspect of the invention, there is provided a heater array including a plurality of heaters providing a plurality of heating areas, a plurality of diodes electrically connected to the plurality of heaters, respectively, and a controller operating the plurality of heaters. In this case, adjacent diodes in the plurality of heating areas may be arranged in substantially opposed directions.

In example embodiments, the heater array may have a 2×2 matrix structure, and orientation of diodes electrically connected to heaters disposed at a first row of the matrix structure may be substantially opposed to orientation of diodes electrically connected to heaters disposed at a second row of the matrix structure.

In example embodiments, the heater array may have an N×N (wherein N is a positive integer) matrix structure, and orientation of diodes electrically connected to heaters disposed at odd number rows of the matrix structure may be substantially opposed to orientation of diodes electrically connected to heaters disposed at even number rows of the matrix structure.

In example embodiments, the controller may include a plurality of control lines for operating the plurality of heaters.

In example embodiments, the heater array may have a 2×2 matrix structure and the number of the control lines for operating 2×2 heaters of the matrix structure may be three.

In some example embodiments, the heater array may have an N×N matrix structure and the number of the control lines for operating N×N heaters of the matrix structure may be N+(N/2).

In example embodiments, the controller may include a plurality of switches for operating the plurality of heaters.

In example embodiments, the heater array may have a matrix structure and the controller may include first switches electrically connected to heaters disposed rows of the matrix structure and second switches electrically connected to heaters disposed columns of the matrix structure.

In example embodiments, the heater array may have a 2×2 matrix structure and the controller may include two first switches and four second switches.

In some example embodiments, the heater array may have an N×N matrix structure and the controller may include N first switches and 2N second switches.

According to another aspect of the invention, there is provided an apparatus for processing a substrate including a process chamber in which a desired process is performed, a supporting unit disposed in the process chamber, and a heater array disposed in the supporting unit. In this case, the heater array may include a plurality of heaters providing a plurality of heating areas, a plurality of diodes electrically connected to the plurality of heaters, respectively, and a controller operating the plurality of heaters wherein adjacent diodes in the plurality of heating areas are arranged in substantially opposed directions.

In example embodiments, the process chamber includes an etching chamber, a deposition chamber a sputtering chamber, a coating chamber, an exposure chamber, a developing chamber, a cleaning chamber, or a drying chamber.

In example embodiments, the supporting unit may have a substantial plate shape and the heater array may have a matrix structure.

In example embodiments, the heater array may have a 2×2 matrix structure, and orientation of diodes electrically connected to heaters disposed at a first row of the matrix structure may be substantially opposed to orientation of diodes electrically connected to heaters disposed at a second row of the matrix structure.

In some example embodiments, the heater array may have an N×N matrix structure, and orientation of diodes electrically connected to heaters disposed at odd number rows of the matrix structure may be substantially opposed to orientation of diodes electrically connected to heaters disposed at even number rows of the matrix structure.

In example embodiments, the controller may include a plurality of control lines and a plurality of switches for operating the plurality of heaters.

In example embodiments, the heater array may have a 2×2 matrix structure and the number of the control lines for operating 2×2 heaters of the matrix structure may be three.

In some example embodiments, the heater array may have an N×N matrix structure and the number of the control lines for operating N×N heaters of the matrix structure may be N+(N/2).

In example embodiments, the heater array may have a 2×2 matrix structure and the controller may include two first switches electrically connected to heaters disposed rows of the matrix structure and four second switches electrically connected to heaters disposed columns of the matrix structure.

In some example embodiments, the heater array may have an N×N matrix structure and the controller may include N first switches electrically connected to heaters disposed rows of the matrix structure and 2N second switches electrically connected to heaters disposed columns of the matrix structure.

According to example embodiments of the invention, in the heater array having the matrix structure, the adjacent diodes may be arranged in the opposed directions and the directions of the currents flowing to the heaters may be controlled by the additional switches and the diodes, thereby reducing the numbers of the control lines for the heater array. Therefore, the apparatus for processing a substrate including the heater array may have simplified configuration although the heater array has more heaters for providing more heating areas.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
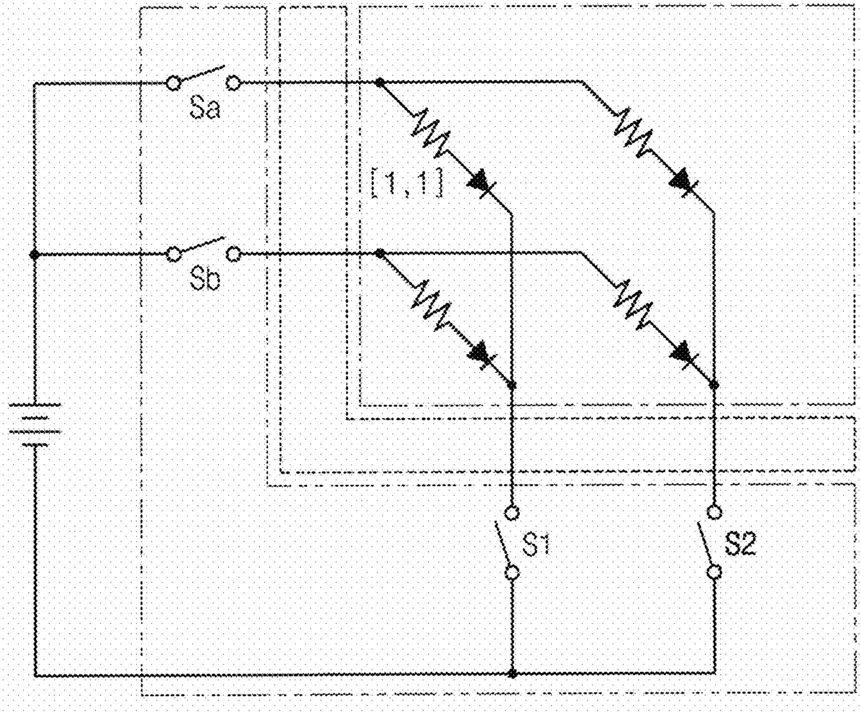
FIG. 1 is a circuit diagram illustrating the conventional heater array.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

To manufacture an integrated circuit device including a semiconductor device or a display device including a flat panel display device, an apparatus for processing a substrate may include various process chambers including, but not limited to, a deposition chamber, an etching chamber, a sputtering chamber, a coating chamber, an exposure chamber, a developing chamber, a cleaning chamber, a drying chamber, etc. In these various process chambers, various processes including, but not limited to, a deposition process, an etching process, a sputtering process, a coating process, an exposure process, a developing process, a cleaning process and a drying process may be executed on a substrate.

In general, a supporting unit may be provided in the process chamber to support the substrate placed on the supporting unit. The supporting unit may include a supporting plate for holding the substrate and a heater array for heating the substrate while a desired process is performed on the substrate in the process chamber. Alternatively, the heater array may be installed in the supporting plate. The heater array may have a matrix structure including a plurality of heaters for heating the substrate to a predetermined temperature. For example, the heater array may include a plurality of heaters arranged in a matrix configuration for providing a plurality of heating regions, a plurality of diodes electrically connected to the plurality of heaters, a controller for controlling the plurality of heaters, and a harness for electrically connecting the controller to the plurality of heaters and the plurality of diodes.

FIG. 1 is a circuit diagram illustrating the conventional heater array. In FIG. 1, a portion indicated by an alternated long and short line represents a plurality of heaters and a plurality of diodes, a portion indicated by a dotted line represents a harness, and a portion indicated by an alternated long and two short line represents a controller.

As illustrated in FIG. 1, the conventional heater array has a matrix structure in which all of the plurality of diodes electrically connected to the plurality of heaters is arranged in one direction. In the conventional heater array including a switch Sa, a switch Sb, a switch S1 and a switch S2, the switch Sa and the switch S1 are turned on so as to operate a heater positioned at a first row and a first column (i.e., [1, 1]) of a matrix structure.

The conventional heater array having 2×2 matrix structure as illustrated in FIG. 1 requires a total of four control lines for operating four heaters. Thus, when the conventional heater array has N×N matrix structure (wherein N is a positive integer), 2N control lines are required in order to operate N×N heaters. As the number of the heaters in the heater array increases, the configuration of the wirings for electrical connections of the components in the conventional apparatus for processing a substrate including the heater array may be complicated, the space for the heater array may be increased, and also the entire configuration of the conventional apparatus for processing a substrate may be more complicated.

To solve the above-mentioned problems, a heater array according to example embodiments may have a structure in which adjacent diodes in a plurality of heating areas may be arranged along opposed directions.

Figure 2:
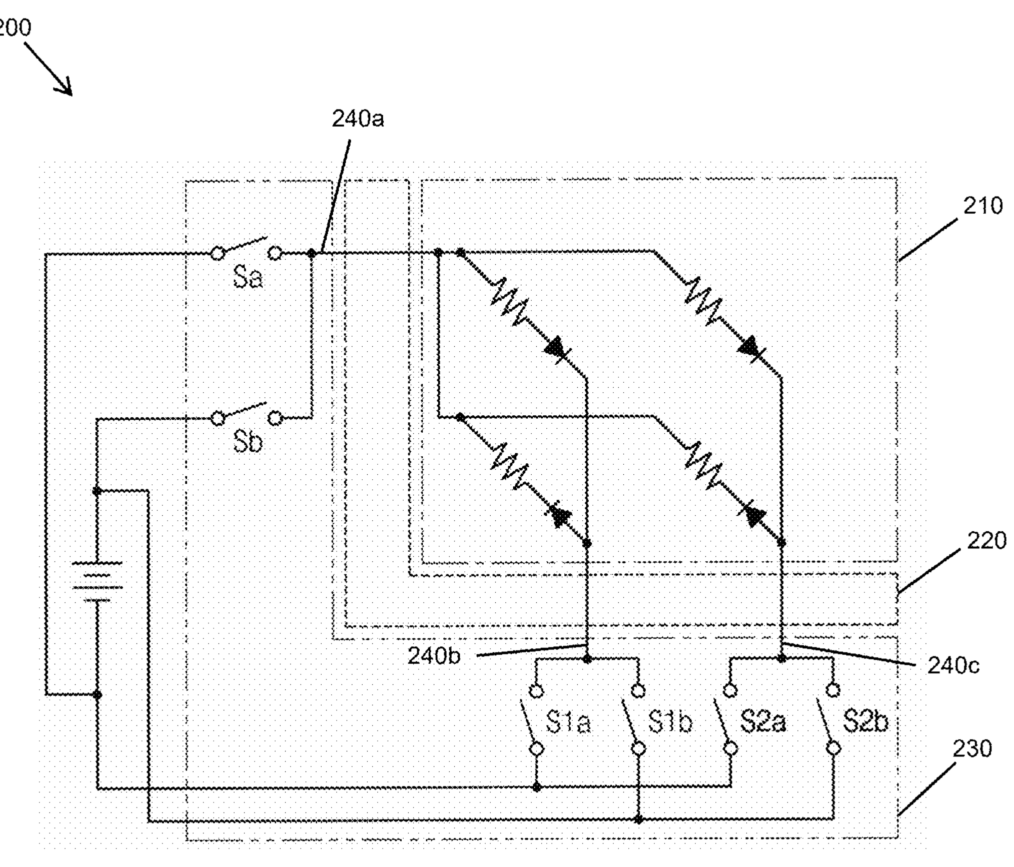
FIG. 2 is a circuit diagram illustrating a heater array in accordance with example embodiments of the invention.

FIG. 2 is a circuit diagram illustrating a heater array 200 in accordance with example embodiments of the invention. In FIG. 2, a portion indicated by an alternated long and short line represents a plurality of heaters and a plurality of diodes 210, a portion indicated by a dotted line represents a harness 220, and a portion indicated by an alternated long and two short line represents a controller 230.

Referring to FIG. 2, the heater array according to example embodiments may have 2×2 matrix structure. In this case, the heater array may include a plurality of heaters, a plurality of diodes electrically connected to the plurality of heaters, a controller 230 for operating the plurality of heaters, a harness 220 for electrically connecting the plurality of heaters and the plurality of diodes to the controller, etc. In this case, the controller may include a power source and a plurality of control lines 240*a*. 240*b*. 240 for controlling the plurality of heaters, respectively. Further, the controller may include a plurality of switches S1*a*, S1*b*, S2*a*, S2*b*, Sa, Sb for adjusting current flows through the plurality of control lines.

In example embodiments, the heater array may have a matrix structure wherein the controller may include a plurality of first switches S a and Sb electrically connected to the heaters arranged at the rows of the matrix structure and a plurality of second switches S1*a*, S1*b*, S2*a* and S2*b* electrically connected to the heaters arranged at the columns of the matrix structure.

As for the heater array having the above-described configuration, the plurality of heaters and the plurality of diodes may provide a plurality of heating areas and adjacent diodes in the plurality of heating areas may be arranged in substantially opposed directions.

As illustrated in FIG. 2, when the heater array has the 2×2 matrix structure, the diodes electrically connected to the heaters disposed at a first row of the matrix structure may be arranged in a direction substantially opposed to a direction in which the diodes electrically connected to the heaters disposed at a second row of the matrix structure are arranged. In other words, when the heater array has an N×N matrix structure (wherein N is a positive integer), the orientation of the diodes electrically connected to the heaters disposed at odd number rows of the matrix structure may be substantially opposed to the orientation of the diodes electrically connected to the heaters disposed at even number rows of the matrix structure.

The controller of the heater array may include a plurality of switches for operating the plurality of heaters and the plurality of diodes arranged in the opposed directions. For example, when the heater array has the 2×2 matrix structure, the controller may include two first switches Sa and Sb and four second switches S1*a*, S1*b*, S2*a* and S2*b* for operating the plurality of heaters and the plurality of diodes. Similarly, the controller may include N first switches and 2N second switches when the heater array has the N×N matrix structure. In this case, the harness of the heater array may not be changed. That is, the harness may be substantially the same as the harness of the conventional heater array. In other words, the heater array may selectively operate one or more desired heater of the plurality of heaters by controlling the additional switches and the plurality diodes arranged in the opposed directions without changing the harness of the conventional heater array. Therefore, the numbers of the wirings for electrical connections of the components in the apparatus for processing a substrate including the heater array may be reduced and also the configuration of the apparatus for processing a substrate may be more simplified.

As illustrated in FIG. 2, the heater array having the 2×2 matrix structure may include the total of three control lines in order to operate the 2×2 heaters. Similarly, the heater array having the N×N matrix structure may require N+(N/2) control lines to operate the N×N heaters. In other words, the heater array according to example embodiments may reduce the number of the control lines by more than about 25% when compared to the number of the control lines of the conventional heater array. As such, the heater array having the configuration capable of decreasing the control lines may have an advantage that the structural complexity of the apparatus for processing a substrate including the heater array can be reduced if the heater array includes more heaters and diodes for providing more heating areas.

Figure 3:
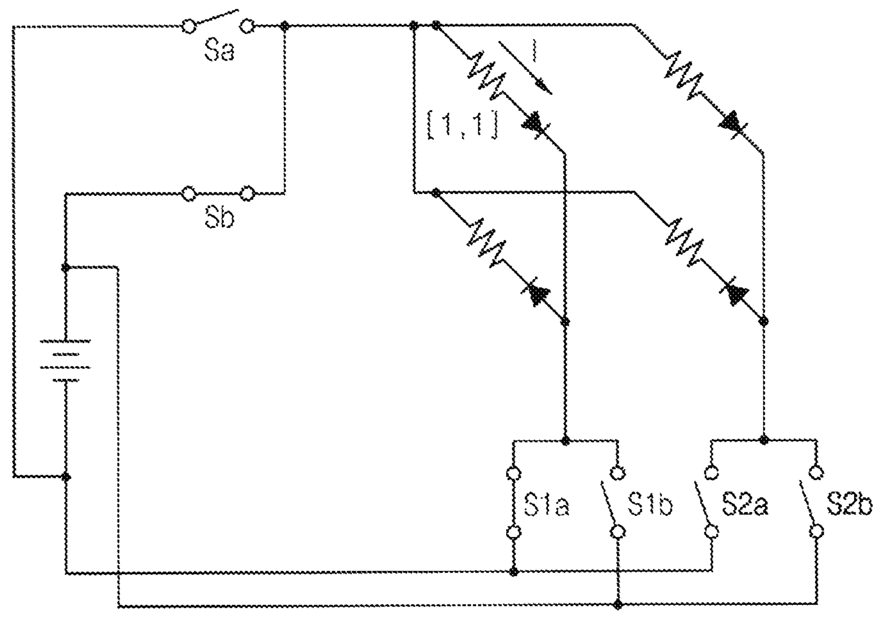
FIG. 3 and FIG. 4 are circuit diagrams illustrating a method for controlling a heater array in accordance with example embodiments of the invention.
Figure 4:
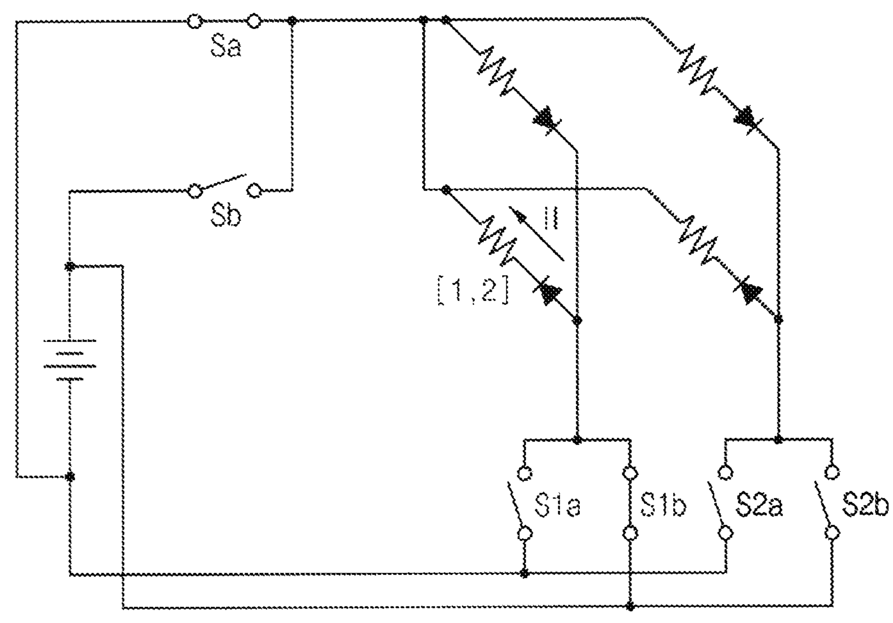

FIG. 3 and FIG. 4 are circuit diagrams illustrating a method for controlling a heater array in accordance with example embodiments of the invention.

FIG. 3 illustrates a configuration of switches for operating a heater disposed at a first row and a first column (i.e., [1, 1]) in the heater array having the 2×2 matrix structure. As illustrated in FIG. 3, when the controller turns on the switch Sb and the switch S1*a*, a current may flow to the heater positioned at the first row and the first column ([1, 1]) as indicated by an arrow I. In this case, the current in the heating array may flow from the power source along a path including the switch S1*a*, the heater disposed at the first row and the first column, and the switch Sb.

FIG. 4 illustrates a configuration of switches for operating a heater disposed at a first row and a second column (i.e., [1, 2]) in the heater array having the 2×2 matrix structure. Referring to FIG. 4, when the controller turns on the switch Sa and the switch S1*b*, a current may flow to the heater positioned at the first row and the second column ([1, 2]) as indicated by an arrow II. In this case, the current in the heating array may flow from the power source along a path including the switch S1*b*, the heater disposed at the first row and the second column, and the switch Sa.

In the heater array illustrated in FIG. 3 and FIG. 4, the harness used to flow the current through the heater positioned at the first row and the first column and the heater disposed at the first row and the second column may be substantially the same as the harness of the conventional heater array. Here, the orientation of adjacent diodes may be adjusted opposed to the direction of the current flowing through the harness such that the current may flow to one or more desired heater. That is, the heating area in the heater array may be selectively controller.

According to example embodiments, in the heater array having the matrix structure, the plurality of adjacent diodes may be arranged in the opposed directions and the current may flow to the plurality of heaters in a forward direction and a reverse direction by the additional switches and the diodes. Therefore, the number of the control lines for the heaters may be reduced. As a result, the apparatus for processing a substrate including the heater array may have a simplified configuration even though the heater array includes more heaters and diodes for providing more heating areas in the heater array.

Figure 5:
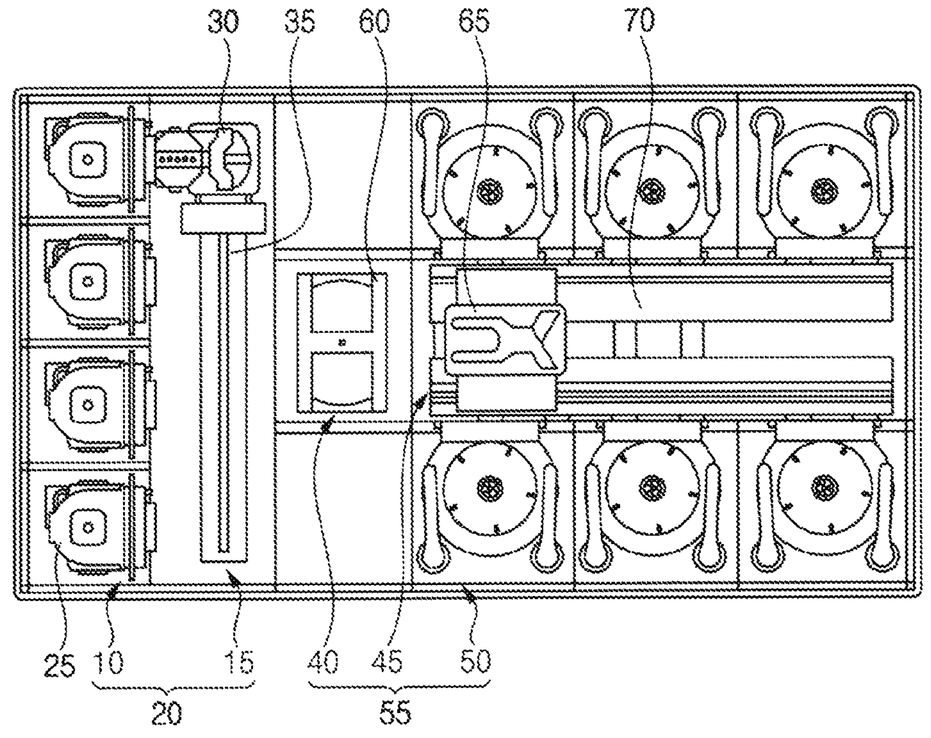
FIG. 5 is a plane view illustrating an apparatus for processing a substrate employing a heater array in accordance with example embodiments of the invention.

FIG. 5 is a plane view illustrating an apparatus for processing a substrate employing a heater array in accordance with example embodiments of the invention.

Referring to FIG. 5, the apparatus for processing a substrate may include an index module 20 and a processing module 55. The index module 20 may transfer a substrate into the processing module 55 from an outside and the processing module 55 may perform a predetermined process on the substrate. Here, the substrate may be utilized for manufacturing an integrated circuit device or a display device. For example, the substrate may include a silicon wafer, a glass substrate, an organic substrate, etc.

The index module 20 may include a load chamber 10 and a transferring frame 15. A carrier 25 for accommodating the substrate may be loaded in the load chamber 10. The transferring frame 15 may transfer the substrate between the carrier 25 and the processing module 55. The transferring frame 15 may include an index robot 30 and an index rail 36.

The index robot 30 may move along the index rail 35 and may transfer the substrate between the index module 20 and the processing module 55. For example, the index robot 30 may transfer the substrate between the carrier 25 and a buffer slot 60 while the index robot 30 moves on the index rail 35.

The processing module 55 may perform the predetermined process including, but not limited to, a deposition process, an etching process, a sputtering process, a coating process, a cleaning process and a drying process, on the substrate. The processing module 55 may include a buffer chamber 40, a transfer chamber 45, a processing chamber 50, a control unit (not illustrated), etc.

The substrate transferred between the index module 20 and the processing module 55 may be temporarily received in the buffer chamber 40. The buffer chamber 40 may include the buffer slot 60 on which the substrate is placed. For example, the buffer chamber 40 may include a plurality of buffer slots 60, and thus a plurality of substrates may be received in the buffer chamber 40.

The transfer chamber 45 may transfer the substrate between the buffer chamber 40 and the processing chamber 50. The transfer chamber 45 may include a transferring robot 65 and a transferring rail 70. The transferring robot 65 may move along the transferring rail 70 such that the transferring robot 65 may transfer the substrate between the buffer chamber 40 and the processing chamber 50. For example, the transferring robot 65 may transfer the substrate placed on the buffer slot 60 into the processing chamber 50 while the transferring robot 65 moves on the transferring rail 70.

In example embodiments, the apparatus for processing a substrate may include a plurality of processing chambers 50 for performing various processes of manufacturing an integrated circuit device including a semiconductor device or a display device including a flat panel display device. For example, the plurality of processing chambers 50 may include, but not limited to, an etching chamber, a deposition chamber, a sputtering chamber, a coating chamber, an exposure chamber, a developing chamber, a cleaning chamber, a drying chamber, etc. In these processing chambers 50, desired processes including an etching process, a deposition process, a sputtering process, a coating process, an exposure process, a developing process, a cleaning process and/or a drying process may be carried out.

The processing chamber 50 may include a supporting unit on which the substrate to be treated is placed. The supporting unit may include a supporting place for holding the substrate and a heater array for heating the substrate while the desired process is performed on the substrate. Here, the heater array may have a structure substantially the same as the structure of the heater array described with reference to FIG. 2. In other words, the heater array may include a plurality of heaters for providing a plurality of heating areas, a plurality of diodes electrically connected to the plurality of heaters, a controller including a plurality of switches for controlling the plurality of heaters, and a harness for electrically connecting the controller to the plurality of heaters and the plurality of diodes. Since the heater array has a configuration in which adjacent diodes may be arranged in opposed directions and currents may flow to the plurality of heaters in a forward direction and a reverse direction by the plurality of switches, the number of control lines in the heater array may be reduce. Accordingly, the apparatus for processing a substrate including the heater array may have a simplified structure.

According to example embodiments of the invention, in the heater array having the matrix structure, the adjacent diodes may be arranged in the opposed directions and the directions of the currents flowing to the heaters may be controlled by the additional switches and the diodes, thereby reducing the numbers of the control lines for the heater array. Therefore, the apparatus for processing a substrate including the heater array may have simplified configuration although the heater array has more heaters for providing more heating areas.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A heater array comprising:

a plurality of heaters providing a plurality of heating areas;

a plurality of diodes electrically connected to the plurality of heaters, respectively; and a controller operating the plurality of heaters and a plurality of control lines for operating the plurality of heaters with each control line coupled to at least one of the plurality of diodes, wherein the heater array has an N×N (wherein N is a positive integer) matrix structure, orientation of diodes electrically connected to heaters disposed at odd number rows of the matrix structure is opposed to orientation of diodes electrically connected to heaters disposed at even number rows of the matrix structure, and diodes electrically connected to heaters disposed at each column of the matrix structure have a same orientation, wherein the controller includes N first switches electrically connected to heaters disposed at rows of the matrix structure and 2N second switches electrically connected to heaters disposed at columns of the matrix structure, wherein, in each column of the matrix structure, each of diodes electrically connected to heaters disposed at each column is connected to two second switches that are arranged in parallel, and the two second switches are connected to a positive pole and a negative pole of a power source, respectively, wherein the N first switches are connected to the positive pole and the negative pole of the power source, depending on the orientation of the plurality of diodes.

2. The heater array of claim 1, wherein the heater array has a 2×2 matrix structure, and orientation of diodes electrically connected to heaters disposed at a first row of the matrix structure is opposed to orientation of diodes electrically connected to heaters disposed at a second row of the matrix structure.

3. The heater array of claim 1, wherein the heater array has a 2×2 matrix structure and the number of the control lines for operating 2×2 heaters of the matrix structure is three.

4. The heater array of claim 1, wherein the number of the control lines for operating N×N heaters of the matrix structure is N+N/2.

5. The heater array of claim 1, wherein the heater array has a 2×2 matrix structure and the controller includes two first switches and four second switches.

6. An apparatus for processing a substrate, which comprises:

a process chamber in which a desired process is performed;

a supporting unit disposed in the process chamber; and a heater array disposed in the supporting unit, wherein the heater array includes a plurality of heaters providing a plurality of heating areas, a plurality of diodes electrically connected to the plurality of heaters, respectively, and a controller operating the plurality of heaters and a plurality of control lines for operating the plurality of heaters with each control line coupled to at least one of the plurality of diodes, wherein the heater array has an N×N (wherein N is a positive integer) matrix structure, orientation of diodes electrically connected to heaters disposed at odd number rows of the matrix structure is opposed to orientation of diodes electrically connected to heaters disposed at even number rows of the matrix structure, and diodes electrically connected to heaters disposed at each column of the matrix structure have a same orientation, wherein the controller includes N first switches electrically connected to heaters disposed at rows of the matrix structure and 2N second switches electrically connected to heaters disposed at columns of the matrix structure, wherein, in each column of the matrix structure, each of diodes electrically connected to heaters disposed at each column is connected to two second switches that are arranged in parallel, and the two second switches are connected to a positive pole and a negative pole of a power source, respectively, wherein the N first switches are connected to the positive pole and the negative pole of the power source, depending on the orientation of the plurality of diodes.

7. The apparatus for processing a substrate of claim 6, wherein the process chamber includes an etching chamber, a deposition chamber a sputtering chamber, a coating chamber, an exposure chamber, a developing chamber, a cleaning chamber, or a drying chamber.

8. The apparatus for processing a substrate of claim 6, wherein the supporting unit has a plate shape and the heater array has a matrix structure.

9. The apparatus for processing a substrate of claim 8, wherein the heater array has a 2×2 matrix structure, and orientation of diodes electrically connected to heaters disposed at a first row of the matrix structure is opposed to orientation of diodes electrically connected to heaters disposed at a second row of the matrix structure.

10. The apparatus for processing a substrate of claim 6, wherein the heater array has a 2×2 matrix structure and the number of the control lines for operating 2×2 heaters of the matrix structure is three.

11. The apparatus for processing a substrate of claim 6, wherein the number of the control lines for operating N×N heaters of the matrix structure is N+N/2.

12. The apparatus for processing a substrate of claim 6, wherein the heater array has a 2×2 matrix structure and the controller includes two first switches electrically connected to heaters disposed rows of the matrix structure and four second switches electrically connected to heaters disposed columns of the matrix structure.

* * * * *